(12) United States Patent
Winkler et al.

(10) Patent No.: US 9,598,277 B2
(45) Date of Patent: *Mar. 21, 2017

(54) CAVITY STRUCTURES FOR MEMS DEVICES

(71) Applicant: Infineon Technologies AG, Neubiberg (DE)

(72) Inventors: Bernhard Winkler, Regensburg (DE); Andreas Zankl, Wiesent (DE); Klemens Pruegl, Regensburg (DE); Stefan Kolb, Unterschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/832,426

(22) Filed: Aug. 21, 2015

(65) Prior Publication Data

US 2015/0353344 A1    Dec. 10, 2015

Related U.S. Application Data

(60) Continuation of application No. 14/281,251, filed on May 19, 2014, now Pat. No. 9,145,292, which is a
(Continued)

(51) Int. Cl.
*B81B 7/00*        (2006.01)
*H01L 27/06*     (2006.01)
*B81C 1/00*       (2006.01)

(52) U.S. Cl.
CPC .......... *B81B 7/008* (2013.01); *B81C 1/00246* (2013.01); *H01L 27/0611* (2013.01);
(Continued)

(58) Field of Classification Search
None
See application file for complete search history.

(56) References Cited

U.S. PATENT DOCUMENTS 4,966,663 A    10/1990   Mauger
5,129,981 A     7/1992   Wang et al.
(Continued)

FOREIGN PATENT DOCUMENTS

CN    101267689 A    9/2008
CN    101479185 A    7/2009
(Continued)

OTHER PUBLICATIONS

Office Action dated Mar. 16, 2015 for Chinese Patent Application No. 2012100381292.
(Continued)

*Primary Examiner* — Joseph Schoenholtz
(74) *Attorney, Agent, or Firm* — Schiff Hardin LLP

(57) ABSTRACT

Embodiments relate to MEMS devices and methods for manufacturing MEMS devices. In one embodiment, the manufacturing includes forming a monocrystalline sacrificial layer on a non-silicon-on-insulator (non-SOI) substrate, patterning the monocrystalline sacrificial layer such that the monocrystalline sacrificial layer remains in a first portion and is removed in a second portion lateral to the first portion; depositing a first silicon layer, the first silicon layer deposited on the remaining monocrystalline sacrificial layer and further lateral to the first portion; removing at least a portion of the monocrystalline sacrificial layer via at least one release aperture in the first silicon layer to form a cavity and sealing the cavity.

11 Claims, 7 Drawing Sheets

Related U.S. Application Data division of application No. 13/032,334, filed on Feb. 22, 2011, now abandoned.

(52) U.S. Cl.
CPC ............... *B81B 2201/0264* (2013.01); *B81B 2203/0315* (2013.01); *B81B 2207/015* (2013.01); *B81C 1/00158* (2013.01); *B81C 2203/0707* (2013.01); *B81C 2203/0714* (2013.01); *B81C 2203/0735* (2013.01); *B81C 2203/0771* (2013.01)

(56) References Cited

U.S. PATENT DOCUMENTS

| | | | |
|---|---|---|---|
| 5,167,778 | A | 12/1992 | Kaneko et al. |
| 5,332,469 | A | 7/1994 | Mastrangelo |
| 5,445,718 | A | 8/1995 | Wang |
| 5,501,893 | A | 3/1996 | Laermer et al. |
| 5,719,073 | A | 2/1998 | Shaw et al. |
| 5,968,336 | A | 10/1999 | Rolfson |
| 6,006,607 | A | 12/1999 | Bryzek et al. |
| 6,093,330 | A | 7/2000 | Chong et al. |
| 6,122,964 | A | 9/2000 | Mohaupt et al. |
| 6,357,299 | B1 | 3/2002 | Aigner et al. |
| 6,379,990 | B1 | 4/2002 | Muller et al. |
| 6,531,068 | B2 | 3/2003 | Laermer et al. |
| 6,653,702 | B2 * | 11/2003 | Ishio ............... B81C 1/00246 257/415 |
| 6,662,663 | B2 | 12/2003 | Chen |
| 7,288,824 | B2 | 10/2007 | Partridge et al. |
| 7,300,854 | B2 | 11/2007 | Benzel et al. |
| 7,321,156 | B2 | 1/2008 | Fischer et al. |
| 7,629,657 | B2 | 12/2009 | Partridge et al. |
| 7,833,405 | B2 | 11/2010 | Benzel et al. |
| 7,859,067 | B2 | 12/2010 | Partridge et al. |
| 8,421,169 | B2 | 4/2013 | Kittilsland et al. |
| 9,145,292 | B2 * | 9/2015 | Winkler ............. B81C 1/00246 |
| 2002/0020053 | A1 | 2/2002 | Fonash et al. |
| 2002/0086456 | A1 | 7/2002 | Cunningham et al. |
| 2002/0086551 | A1 | 7/2002 | Beetz et al. |
| 2002/0137348 | A1 | 9/2002 | Mlcak |
| 2002/0148807 | A1 | 10/2002 | Zhao et al. |
| 2002/0185469 | A1 | 12/2002 | Podlesnik et al. |
| 2003/0215974 | A1 | 11/2003 | Kawasaki et al. |
| 2004/0067346 | A1 | 4/2004 | Hofmann et al. |
| 2004/0163476 | A1 * | 8/2004 | Partridge ............. B81C 1/00047 73/754 |
| 2005/0176198 | A1 | 8/2005 | Kudelka |
| 2006/0101912 | A1 * | 5/2006 | Wu .................... B60C 23/0408 73/514.34 |
| 2006/0231521 | A1 | 10/2006 | Chilcott |
| 2006/0292877 | A1 | 12/2006 | Lake |
| 2007/0072428 | A1 | 3/2007 | Chilcott |
| 2007/0077727 | A1 | 4/2007 | Huang et al. |
| 2007/0170528 | A1 | 7/2007 | Partridge et al. |
| 2008/0061029 | A1 | 3/2008 | Lai et al. |
| 2008/0237756 | A1 * | 10/2008 | Partridge ............ B81C 1/00333 257/415 |
| 2008/0293250 | A1 | 11/2008 | Dussart et al. |
| 2009/0007681 | A1 | 1/2009 | Stewart et al. |
| 2009/0309175 | A1 | 12/2009 | Partridge et al. |
| 2010/0001615 | A1 | 1/2010 | Steeneken et al. |
| 2010/0003143 | A1 | 1/2010 | Toonder et al. |
| 2010/0147070 | A1 | 6/2010 | Jun et al. |
| 2010/0313660 | A1 | 12/2010 | Nishikage et al. |
| 2011/0132872 | A1 | 6/2011 | Van De Sande et al. |
| 2011/0207323 | A1 | 8/2011 | Ditizio |
| 2011/0227558 | A1 | 9/2011 | Mannion et al. |
| 2012/0126346 | A1 | 5/2012 | Hoechst et al. |
| 2012/0205753 | A1 | 8/2012 | Adams et al. |
| 2012/0264249 | A1 | 10/2012 | Kundalgurki et al. |
| 2015/0001665 | A1 | 1/2015 | Kautzsch |
| 2015/0353344 | A1 * | 12/2015 | Winkler ............. B81C 1/00246 257/254 |

FOREIGN PATENT DOCUMENTS

| | | |
|---|---|---|
| DE | 4000496 A1 | 2/1991 |
| DE | 19700290 A1 | 7/1998 |
| WO | WO-2007087021 A2 | 8/2007 |
| WO | WO-2010052684 A2 | 5/2010 |

OTHER PUBLICATIONS

Bosch, Research Info, Revolution Under the Hook, http://researchinfo.bosch.com, Issue Jan. 2003, 4 pgs.

Dr. Peter Ernst, MEMS@Bosch: Automotive Applications and Beyond, Jun. 4, 2007, 9 pgs.

Vigna, Benedetto, EE times, Making MEMS: A Short guide, Oct. 7, 2008, 2 pgs.

LPS001 WP, MEMS pressure sensor 300-1100 mbar absolute digital output barometer, Doc ID 18171, Rev. 1, Nov. 2010, pp. 1-6.

SiTime: Its About Time SiTime's MEMS First™ Process, SiT-AN20001 Rev. 1.7, Feb. 17, 2009, pp. 1-6.

Rogers, T., Selective Anodization Using Masked Deep Ion Implantation, J. Micromech. Microeng. 3, 1993, pp. 146-148.

Prime Faraday Technology Watch, ISBN 1-84402-020-7, An Introduction to MEMS, Jan. 2002, An Introduction to MEMS (Microelectromechanical Systems).

Semiconductor Materials Product Guide, MEMC at p. 5 downloaded from URL http://sunedisonsilicon.com/assets/file/products/semiconductor/SunEdison_Semiconductor_brochure.pdf, Aug. 29, 2013.

Definition of Standard downloaded from URL http://www.thefreedictionary.com/standard on Sep. 1, 2013.

Chinese Office Action, Chinese Application No. 201210038129.2, mailed Jun. 24, 2014, 8 pgs.

Application and File History for U.S. Appl. No. 13/864,762, filed Apr. 17, 2013, Inventors: Behrendt, et al.

* cited by examiner

… (1)

CAVITY STRUCTURES FOR MEMS DEVICES

REFERENCE TO RELATED APPLICATIONS

This application is a continuation of U.S. patent application Ser. No. 14/281,251 filed on May 19, 2014 which is a continuation of U.S. patent application Ser. No. 13/032,334 filed on Feb. 22, 2011 and claims the benefit of the priority date of the above US application. The entire content of the above identified prior filed applications is hereby entirely incorporated herein by reference.

TECHNICAL FIELD

The invention relates generally to microelectromechanical systems (MEMS) devices and more particularly to MEMS devices and electrical devices on a single wafer.

BACKGROUND

MEMS devices, such as sensors, and related electrical devices, such as an application-specific integrated circuit (ASIC), are typically implemented on separate chips because the fabrication processes for each are incompatible with the other. For example, in modern CMOS technologies it can be critical to avoid high temperatures in order to preserve doping profiles, whereas high temperature steps may be necessary in steps of the electrical device fabrication. There are many disadvantages associated with two-chip solutions, including more complex and expensive packaging and the inability to implement applications requiring processing of very small signals.

More recently, so-called "MEMS first" processes have been developed for integrating MEMS and electrical devices on a single chip. Such processes, however, still present drawbacks and disadvantages, leaving room for improvement.

Therefore, there is a need for improved systems and methods that enable MEMS and electrical devices to be implemented on a single wafer.

SUMMARY

Embodiments are directed to monolithic integrated MEMS sensor devices and electrical devices and method related thereto.

In an embodiment, a method of manufacturing includes forming a monocrystalline sacrificial layer on a non-silicon-on-insulator (non-SOI) substrate, patterning the monocrystalline sacrificial layer such that the monocrystalline sacrificial layer remains in a first portion and is removed in a second portion lateral to the first portion; depositing a first silicon layer, the first silicon layer deposited on the remaining monocrystalline sacrificial layer and further lateral to the first portion; removing at least a portion of the monocrystalline sacrificial layer via at least one release aperture in the first silicon layer to form a cavity and sealing the cavity.

In an embodiment, a microelectromechanical system (MEMS) device comprises a non-silicon-on-insulator (non-SOI) substrate, a cavity formed on a first portion of the non-SOI substrate, a monocrystalline layer comprising a first portion formed on the non-SOI substrate and a second portion formed above the cavity, wherein the cavity comprises a cavity sidewall, the cavity sidewall comprising a first portion of the first monocrystalline layer. The MEMS device further comprises a MEMS structure comprising the second portion of the monocrystalline layer.

BRIEF DESCRIPTION OF THE DRAWINGS

The invention may be more completely understood in consideration of the following detailed description of various embodiments of the invention in connection with the accompanying drawings, in which.

Figure 1A:
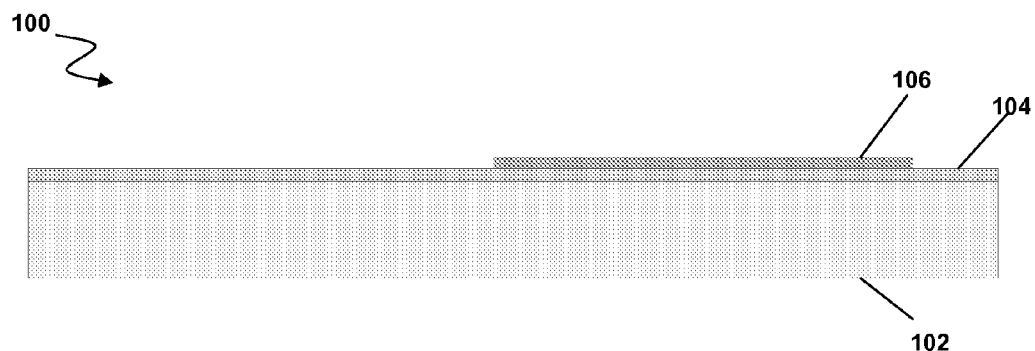
FIGS. 1A-1E depict stages in the fabrication of a capacitive MEMS device integrated with an electrical device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to MEMS devices, particularly MEMS devices integrated with related electrical devices on a single wafer. Embodiments utilize a modular process flow concept as part of a MEMS-first approach, enabling use of a novel cavity sealing process. The impact and potential detrimental effects on the electrical devices by the MEMS processing are thereby reduced or eliminated. At the same time, a highly flexible solution is provided that enables implementation of a variety of measurement principles, including capacitive and piezoresistive. A variety of sensor applications can therefore be addressed with improved performance and quality while remaining cost-effective.

FIG. 1 depicts stages in the fabrication of a capacitive MEMS device 100 with a local sacrificial layer, such as oxide. FIG. 1A depicts a silicon substrate 102 having an implanted layer 104. In one embodiment, substrate 102 is a p-type substrate, and layer 104 is an n-type implanted layer, forming a pn-junction. A patterned sacrificial layer 106 is formed on layer 104. In one embodiment, sacrificial layer 106 comprises oxide.

Figure 1B:
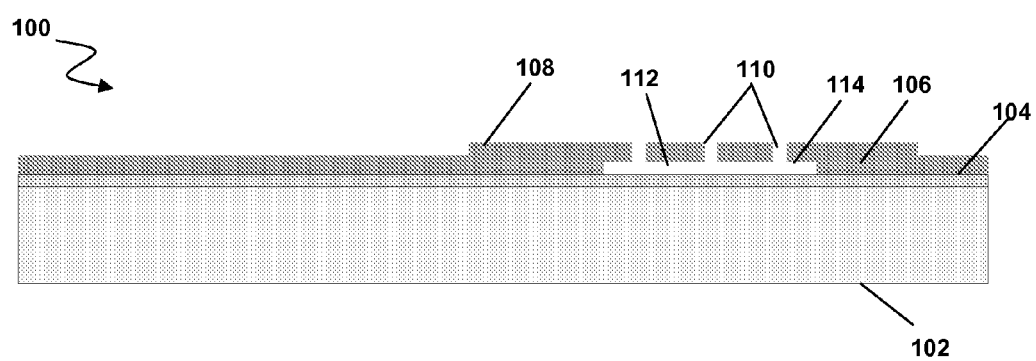

In FIG. 1B, a silicon layer 108 has been deposited, for example by epitaxial growth in an embodiment. Silicon layer 108 comprises release apertures 110 through which a cavity 112 is formed by sacrificial layer etching. In embodiments, cavity 112 is about 50 nanometers (nm) to about 100 nm high (with respect to the orientation of the drawing on the page). An optional cavity passivation layer 114, such as silicon oxide or silicon nitride, is deposited and etched back to assist with later cavity sealing.

Figure 1C:
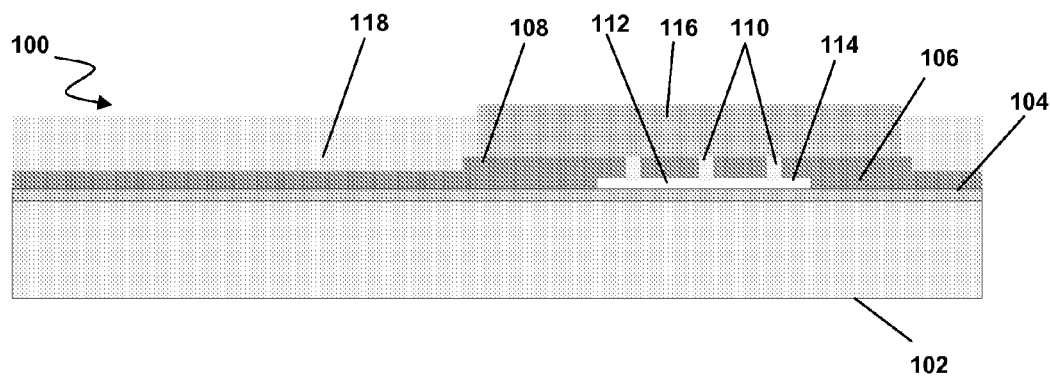

In FIG. 1C, a silicon layer 116 deposited by epitaxial growth seals cavity 112. Optional cavity passivation layer 114, if implemented in embodiments, can help to avoid silicon growth in cavity 112 under certain process conditions. As depicted in FIG. 1C, the result is a polycrystalline silicon sealed membrane 116 on top of cavity 112, with remaining sacrificial layer 108 and a monocrystalline silicon 118 on the other areas of the surface of substrate 102.

Figure 1D:
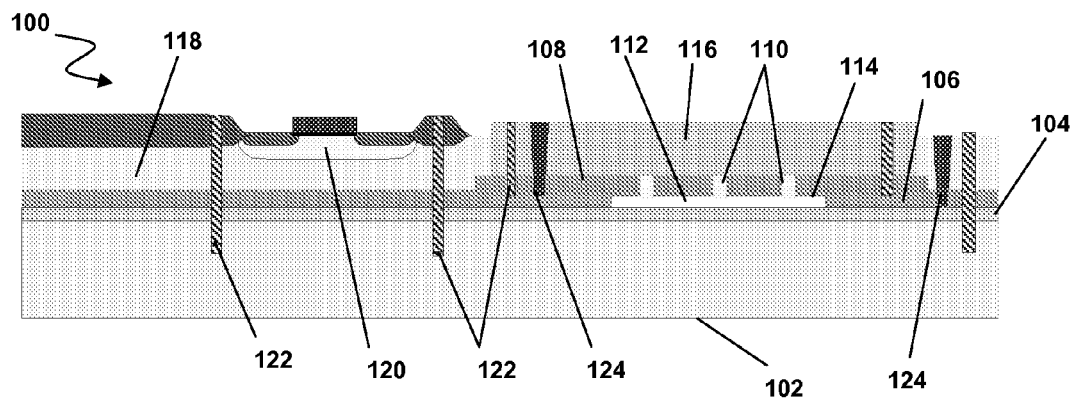

In FIG. 1D, because of the monocrystalline silicon formed next to membrane structure 116, electrical devices such as a MOS transistor 120 can be processed in common CMOS or BICMOS processes on the same wafer 102. Lateral electrical isolation can be achieved by isolation trenches 122, and electrical contact to top and bottom electrodes can be carried out by contacts structures 124.

Figure 1E:
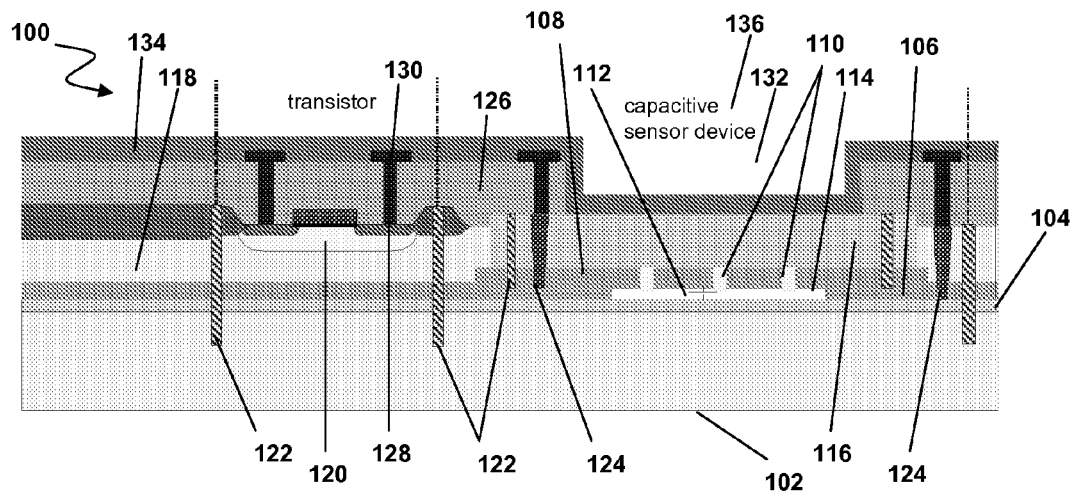

In FIG. 1E, a common wafer finishing process with intermetal oxide 126, electrical contacts 128 and metallization 130 can be applied. After sensor release at 132 and passivation 134, a capacitive sensor device 136, such as a pressure sensor in an embodiment, is formed next to electrical devices, such as transistor 120, on the same wafer 102. In other embodiments, sensor device 136 can comprise another sensor technology, such as a piezoresistive sensor, and transistor 120 can comprise some other electrical device. While FIG. 1 is an example for monolithic integrated sensor technology, the concept also has the flexibility to create a discrete sensor device without electrical devices if necessary or desired in specific applications.

FIG. 2 depicts stages in the fabrication of a capacitive MEMS device 200 with a local monocrystalline sacrificial layer, such as silicon germanium (SiGe) or doped silicon in embodiments. In FIG. 2A, a silicon substrate 202 has an implanted layer 204. In an embodiment, substrate 202 is a p-type substrate, and layer 204 n-type, such that a vertical pn-junction is formed. A monocrystalline sacrificial layer 206 is patterned on layer 104. Sacrificial layer 206 can comprise SiGe or doped silicon with a different dopant type or doping concentration than the silicon material 204 interfacing layer 206.

Figure 2A:
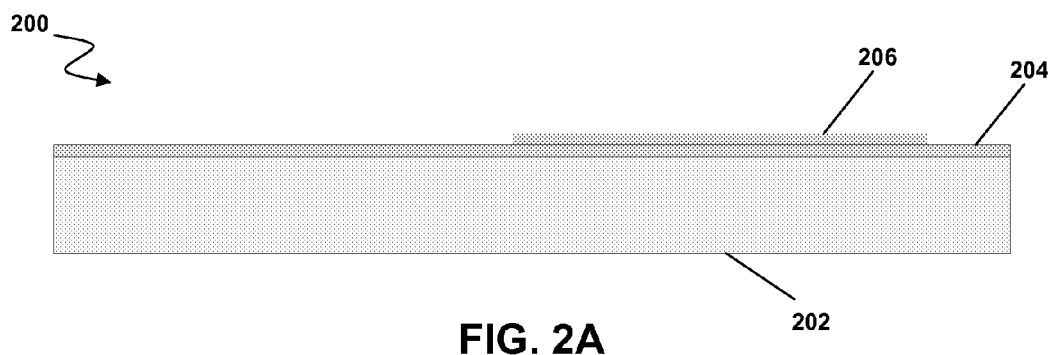
FIGS. 2A-2D depict stages in the fabrication of a capacitive MEMS device integrated with an electrical device according to an embodiment.
Figure 2B:
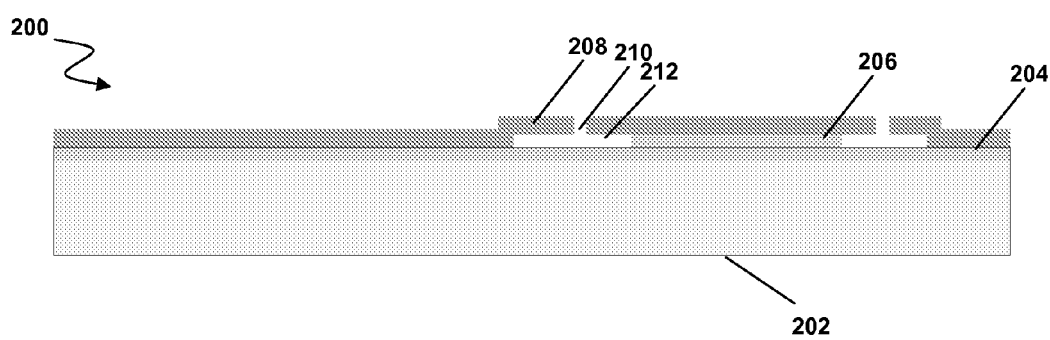

Referring to FIG. 2B, the monocrystalline nature of sacrificial layer 206 permits formation of a monocrystalline layer 208 by epitaxial growth next to and on top of sacrificial layer 206. Through release apertures 210, a portion sacrificial layer 206 is removed to form cavity 212. Examples of this process sequence are discussed in DE 19700290, which is incorporated herein by reference in its entirety. In embodiments, cavity 212 is about 50 nm to about 100 nm high (with respect to the orientation of the drawing on the page).

Figure 2C:
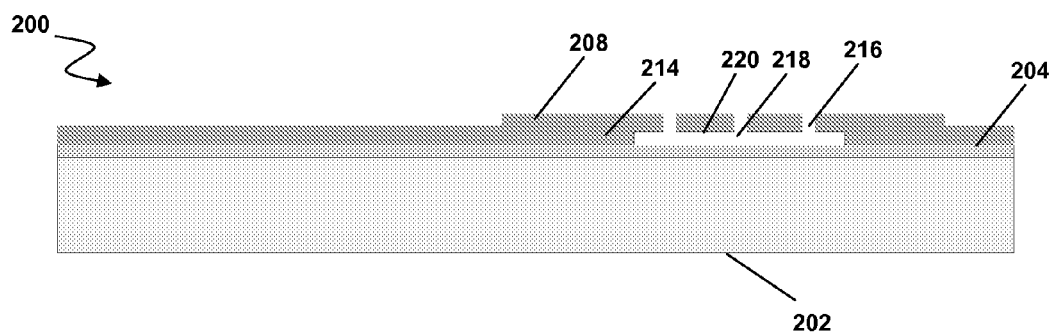

Referring to FIG. 2C, cavity 212 and release apertures 210 are filled with a filling material 214, such as oxide, for isolation and removed from the wafer surface. Through release apertures 216 formed over remaining sacrificial layer 206, a cavity 218 is formed by another sacrificial layer etch. An optional cavity passivation layer 220, such a silicon oxide or silicon nitride, is deposited and etched back on the wafer surface to assist with later cavity sealing.

Figure 2D:
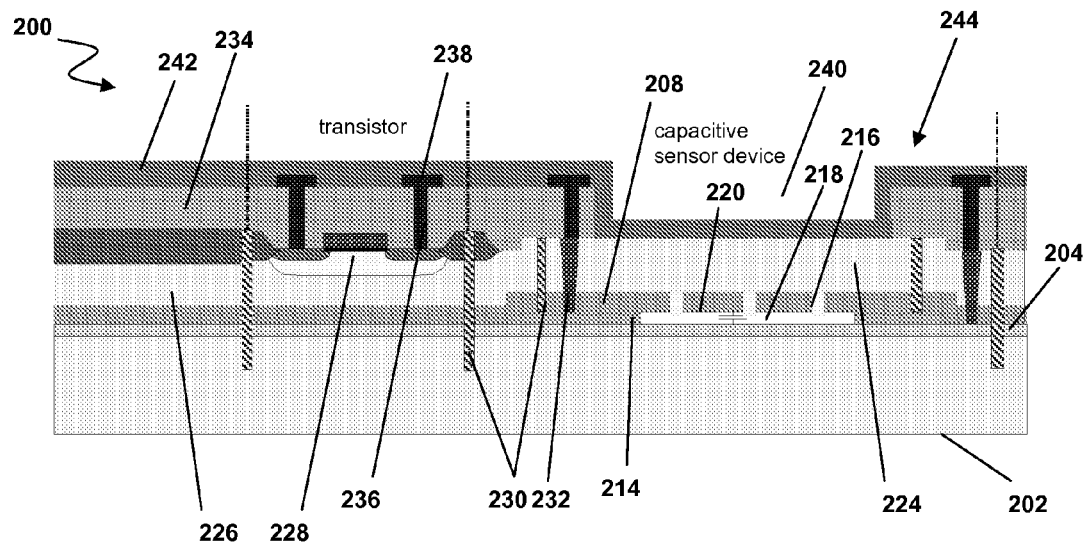

Referring to FIG. 2D, a silicon layer 222 deposted by epitaxial growth seals cavity 218. Cavity passivation layer 220 can help to avoid silicon growth inside cavity 218 under certain process conditions. The result is a monocrystalline silicon sealed membrane 224 on top of cavity 218 and a monocrystalline silicon 226 on other areas of the wafer surface.

Because of the monocrystalline silicon 226, electrical devices like a MOS transistor 228 can be formed on the same wafer 202 in common CMOS or BICMOS processes. Lateral electrical isolation can be provided by isolation trenches 230, with electrical contact to the bottom and top electrodes of the capacitive sensor device provided by contact structures 232.

A common wafer finishing process with intermetal oxide 234, electrical contacts 236 and metallization 238 can be applied. After sensor release 240 and passivation 242, a capacitive sensor device 244, such as a pressure sensor, has been formed with an electrical device, such as transistor 228, on the same wafer 202. In other embodiments, sensor device 244 can comprise another sensor technology and transistor 228 can comprise some other electrical device. While FIG. 2, like FIG. 1, is an example for monolithic integrated sensor technology, the concept also has the flexibility to create a discrete sensor device without electrical devices if necessary or desired in specific applications.

Figure 3:
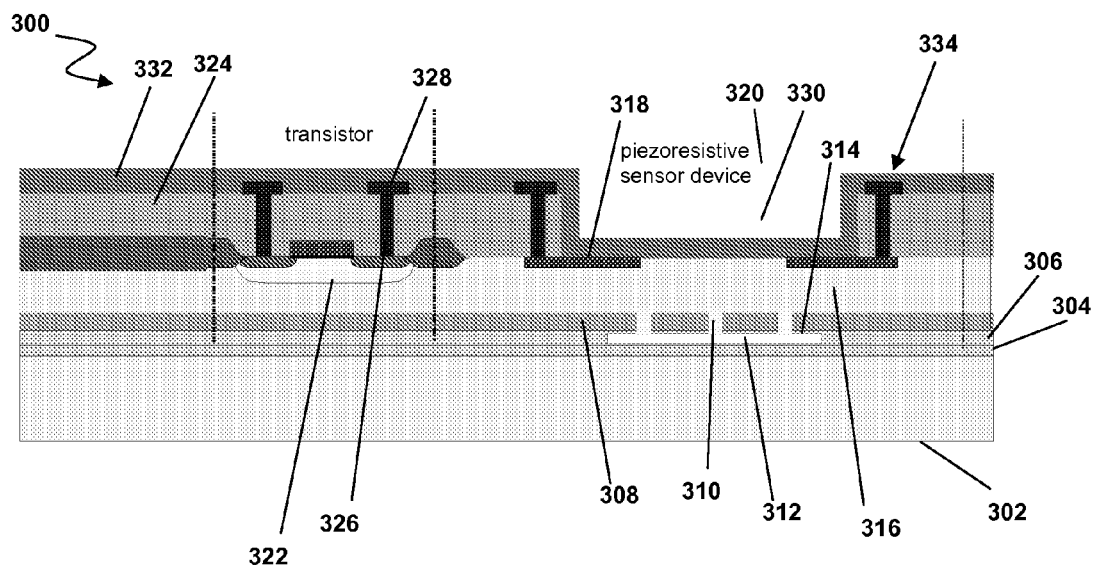
FIG. 3 depicts a piezoresistive MEMS device integrated with an electrical device according to an embodiment.

FIG. 3 depicts a piezoresistive MEMS device 300 with a monocrystalline sacrificial layer, such as silicon germanium (SiGe) or doped silicon in embodiments. In the embodiment of FIG. 3, in contrast with those of FIGS. 1 and 2, a monocrystalline sacrificial layer need not be patterned because isolation is not needed in this piezoresistive sensing embodiment as it was in the aforementioned capacitive sensing embodiments.

Device 300 comprises a silicon substrate 302 with an implanted layer 304. In an embodiment, substrate 302 is a p-type substrate, and layer 304 is an n-type implanted layer. A monocrystalline sacrificial layer 306 is formed on layer 304. Sacrificial layer 306 can comprise, for example, SiGe or doped silicon having a different dopant type and/or concentration than the silicon material at the interface of layers 304 and 306.

Monocrystalline sacrificial layer 306 enables formation of a monocrystalline layer 308 on layer 306 by epitaxial growth. Through release apertures 310, a cavity 312 can be formed by sacrificial etch, such as is described in DE19700290, which is incorporated herein by reference in its entirety. In embodiments, cavity 312 is about 50 nm to about 100 nm high (with respect to the orientation of the drawing on the page). An optional cavity passivation layer 314, such as silicon oxide or silicon nitride or some other suitable material, is deposited and etched back on the wafer surface to assist with later cavity sealing. A silicon layer 316 deposited by epitaxial growth seals cavity 312, with cavity passivation layer 314, if present, assisting to avoid silicon growth inside cavity 312 under certain process conditions. The result thus far is a monocrystalline silicon sealed membrane 316 on top of a cavity 312, with the monocrystalline silicon also on all other areas of the wafer surface. Implantation of piezoresistors 318 on monocrystalline membrane 316 provides a piezoresistive sensor device 320.

The monocrystalline silicon 316 enables electrical devices such as a MOS transistor 322 to be processed in common CMOS or BICMOS processing concepts on the same wafer 302. A common wafer finishing process with intermetal oxide 324, electrical contacts 326 and metallization 328 can be applied. After sensor release 330 and passivation 332, a piezoresistive sensor device 334, such as a pressure sensor, has been formed next an electrical device, such as a transistor 322, on the same wafer 302. In other embodiments, sensor device 334 can comprise another sensor technology and transistor 322 can comprise some other electrical device. While FIG. 3, like FIGS. 1 and 2, is an example for monolithic integrated sensor technology, the concept also has the flexibility to create a discrete sensor device without electrical devices and/or both capacitive and piezoresistive sensor devices on the same wafer if necessary or desired in specific applications.

FIG. 4 depicts stages in the fabrication of a capacitive MEMS device 400 formed on a silicon on insulator (SOI)

substrate. While SOI can be more expensive than other technologies, it can provide a simplified process flow in embodiments.

Figure 4A:
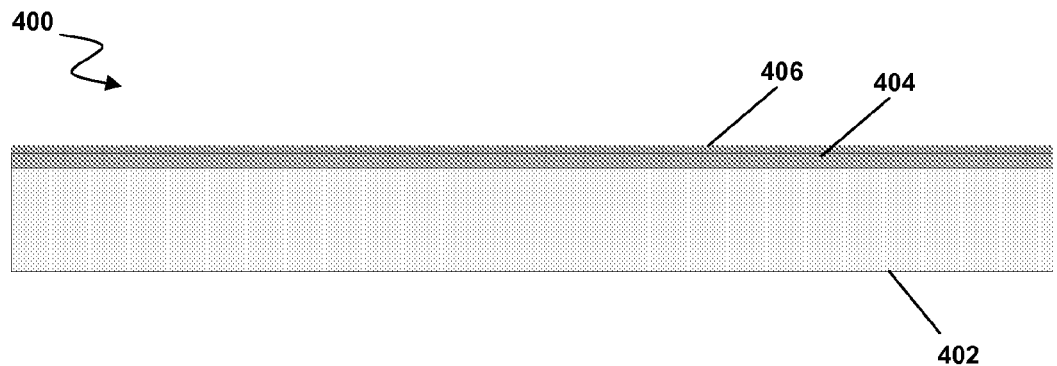
FIGS. 4A-4G depict stages in the fabrication of a capacitive MEMS device integrated with an electrical device according to an embodiment.

Referring to FIG. 4A, an SOI substrate comprises a silicon substrate 402, a box oxide layer 404 and a thin silicon device layer 406. In embodiments, layer 406 is about 100 nm to about 400 nm thick.

Figure 4B:
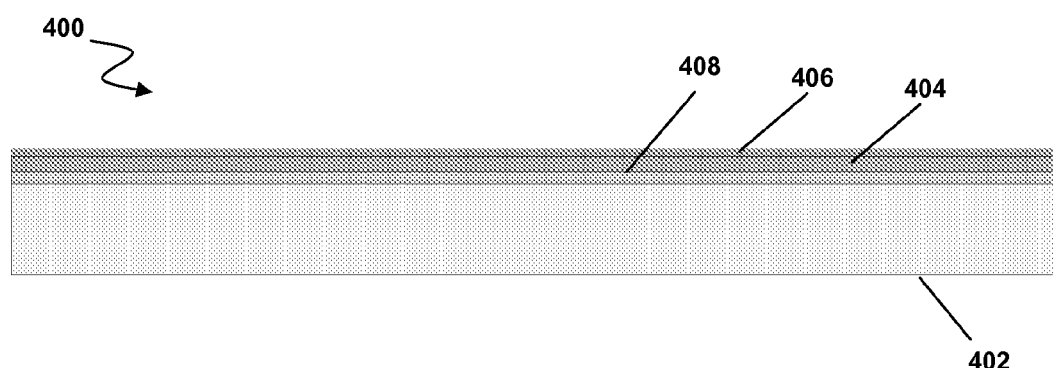

In FIG. 4B, a doped layer 408 below box oxide layer 404 is formed by high-energy implantation. Layer 408 thus can form a bottom electrode for MEMS devices.

Figure 4C:
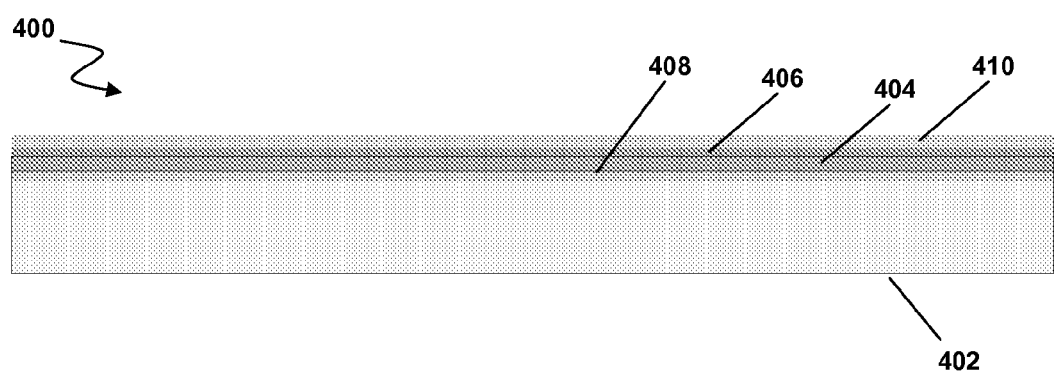

In FIG. 4C, a monocrystalline silicon layer 410 is formed by epitaxial growth.

Figure 4D:
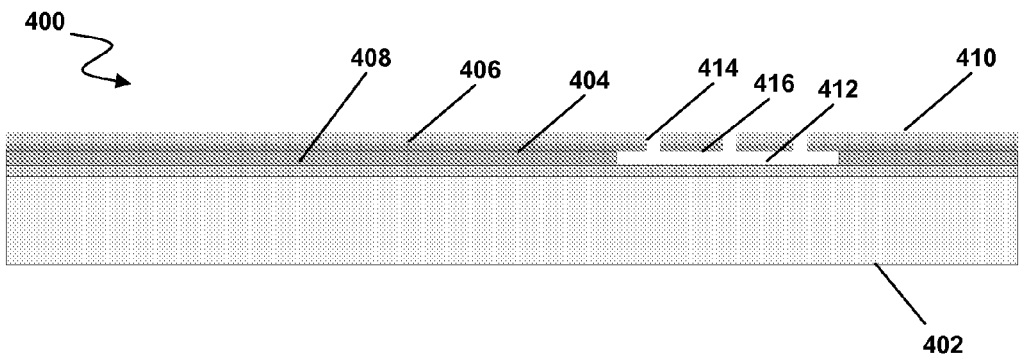

In FIG. 4D, a cavity 412 is formed by sacrificial layer etch through release apertures 414. In embodiments, cavity 412 is about 50 nm to about 100 nm high (with respect to the orientation of the drawing on the page). An optional cavity passivation layer 416, such as silicon oxide, silicon nitride or some other suitable material, is deposited and etched back on the wafer surface and can later assist with cavity sealing.

Figure 4E:
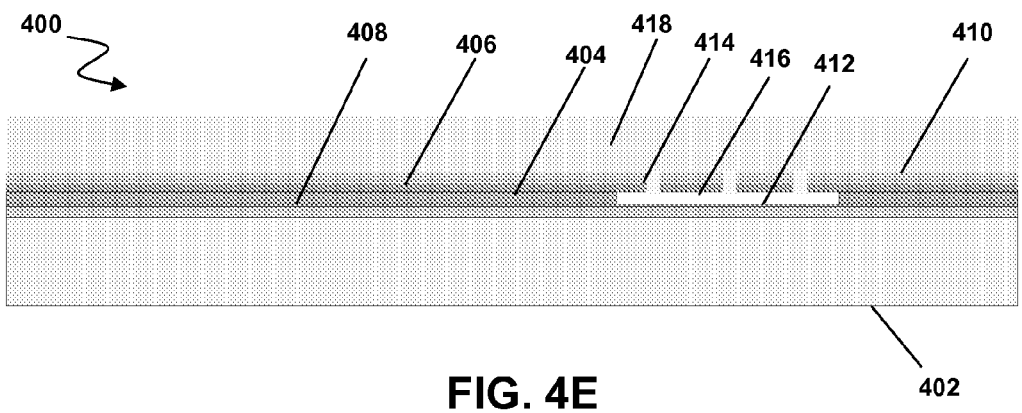

In FIG. 4E, a silicon layer 418 is deposited by epitaxial growth and seals cavity 412. Cavity passivation layer 416 can help to prevent silicon growth inside cavity 412 under certain process conditions. What results is a monocrystalline silicon sealed membrane 418 on top of cavity 412 with a monocrystalline silicon (418) also on all other areas of the wafer surface.

Figure 4F:
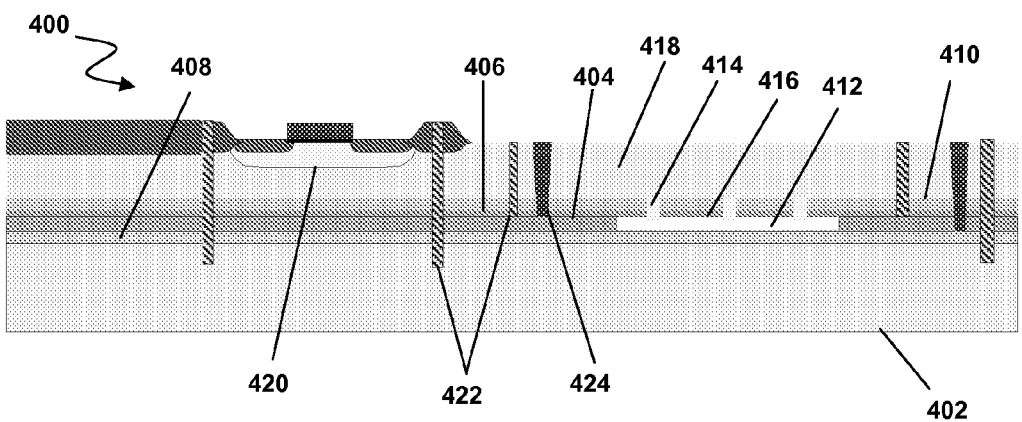

In FIG. 4F, a MOS transistor 420 or another electrical device is formed in common CMOS or BICMOS processing on the same wafer 402, enabled by the monocrystalline silicon 418. Lateral electrical isolation between the MEMS device and transistor 420 can be accomplished by isolation trenches 422. Electrical contact with the top and bottom electrodes of the sensor device can be established by contact structures 424.

Figure 4G:
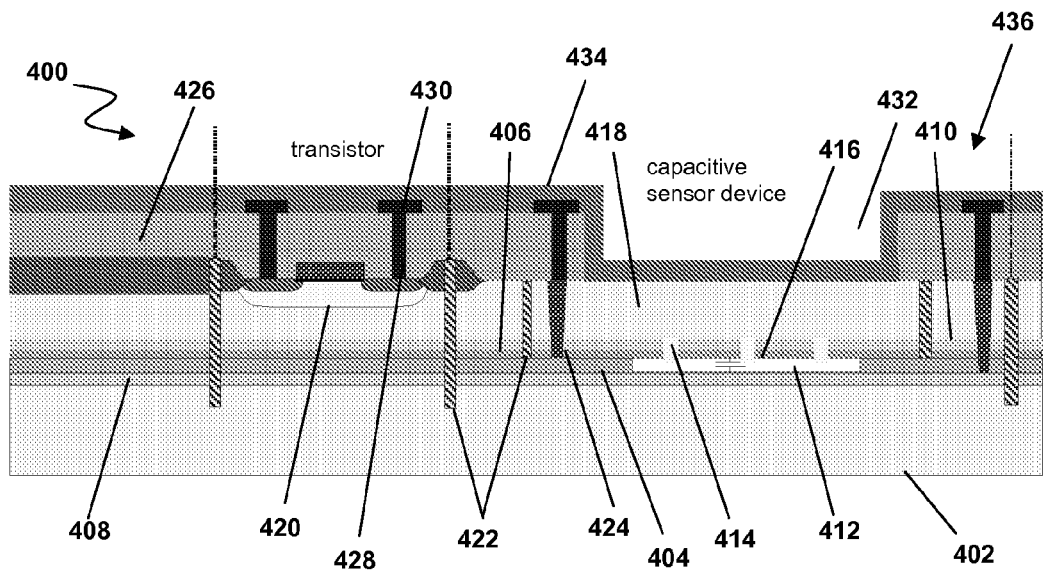

In FIG. 4G, a common wafer finishing process with intermetal oxide 426, electrical contacts 428 and metallization 430 can be applied. After sensor release 432 and passivation 434, a capacitive sensor device 436, such as a pressure sensor, is created beside and on the same wafer as electrical devices, such as transistor 420. In other embodiments, sensor device 436 can comprise another sensor technology, and transistor 420 can comprise some other electrical device. While FIG. 4, like FIGS. 1-3, is an example for monolithic integrated sensor technology, the concept also has the flexibility to create a discrete sensor device without electrical devices on the same wafer if necessary or desired in specific applications.

Figure 5:
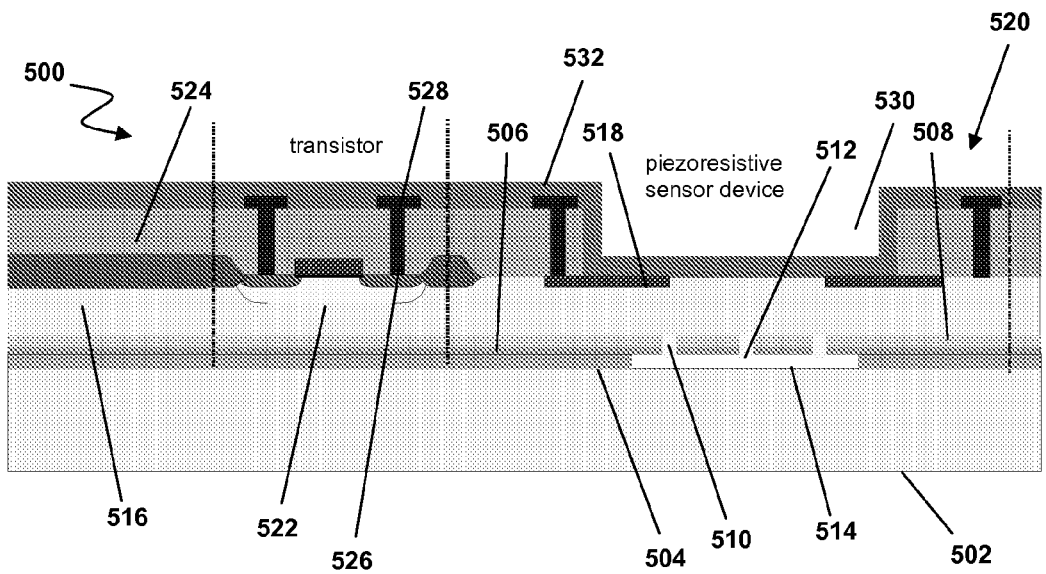
FIG. 5 depicts a piezoresistive MEMS device integrated with an electrical device according to an embodiment.

FIG. 5 depicts stages a piezoresistive MEMS device 500 formed on a SOI substrate. While SOI can be more expensive than other technologies, it can provide a simplified process flow in embodiments. An SOI substrate 502 has a box oxide layer 504 and a silicon device layer 506 formed thereon. In embodiments, layer 506 is about 100 nm to about 400 nm thick. A monocrystalline silicon layer 508 is formed on layer 504 by epitaxial growth. Through release apertures 510, a cavity 512 is formed by sacrificial layer etch. In embodiments, cavity 512 is about 50 nm to about 100 nm high (with respect to the orientation of the drawing on the page). An optional cavity passivation layer 514, such as silicon oxide, silicon nitride or some other suitable material, is deposited and etched back on the wafer surface to assist with later cavity sealing.

A silicon layer 516 is then deposited by epitaxial growth, sealing cavity 512. Cavity passivation layer 514 can help to avoid silicon growth inside cavity 512 under certain process conditions. The result is thus a monocrystalline silicon sealed membrane 516 on cavity 512, with monocrystalline silicon on all other areas of the wafer surface.

Implantation of piezoresistors 518 on the monocrystalline membrane 516 forms a piezoresistive sensor device 520.

Monocrystalline layer 516 enables electrical devices, such as a MOS transistor 522, to be processed in common CMOS or BICMOS on the same wafer 502. A common wafer finishing process with intermetal oxide 524, electrical contacts 526 and metallization 528 can be applied. After sensor release 530 and passivation 532, a piezoresistive sensor device 520, such as a pressure sensor, is formed next to an electrical device, such as transistor 522 or some other device, on the same wafer 502. In other embodiments, sensor device 520 can comprise another sensor technology, and transistor 522 can comprise some other electrical device. While FIG. 5, like FIGS. 1-4, is an example for monolithic integrated sensor technology, the concept also has the flexibility to create a discrete sensor device without electrical devices and/or both capacitive and piezoresistive sensor devices on the same wafer if necessary or desired in specific applications.

Embodiments thereby provide cost-efficient, flexible solutions for monolithic integration of MEMS structures in modern CMOS and BICMOS technologies. Negative interactions between MEMS and electrical processing steps are avoided, at least in part by utilizing a novel cavity sealing process. The smaller dimensions of the cavity that can be implemented in embodiments also improve the robustness of the device, reducing the risk of over-stress. Further, advantages in test stages of manufacturing can also be provided in embodiments by enabling use of an applied voltage rather than a physical pressure or acceleration load, thereby reducing test complexity and efforts. This is enabled at least in part by the narrower cavity. High flexibility for a variety of sensing principles, such as capacitive and piezoresistive, is provided based on the same MEMS technology platform.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method of manufacturing a microelectromechanical system (MEMS) device, the method comprising:
    forming a monocrystalline sacrificial layer on a non-silicon-on-insulator (non-SOI) substrate;
    patterning the monocrystalline sacrificial layer such that the monocrystalline sacrificial layer remains in a first portion and is removed in a second portion lateral to the first portion;
    depositing a first silicon layer, the first silicon layer deposited on the remaining monocrystalline sacrificial layer and further lateral to the first portion;
    removing at least a portion of the monocrystalline sacrificial layer via at least one release aperture in the first silicon layer to form a cavity; and
    sealing the cavity.

2. The method of claim 1, further comprising depositing a cavity passivation layer in the cavity.

3. The method of claim 1, wherein removing the monocrystalline layer comprises patterning the monocrystalline sacrificial layer.

4. The method of claim 1, further comprising forming a transistor in the second portion, wherein forming the transistor further comprises utilizing the first silicon layer.

5. The method of claim 1, wherein sealing the cavity further comprises depositing a second layer that comprises monocrystalline silicon.

6. The method of claim 1, wherein forming a MEMS device comprises forming a sensor device.

7. The method of claim 6, wherein forming a sensor device comprises forming at least one of a capacitive sensor device or a piezoresistive sensor device.

8. The method of claim 4, further comprising forming a transistor in the second portion, the transistor comprising at least a portion of the first silicon layer.

9. The method of claim 4, wherein forming the transistor comprises utilizing one of a CMOS or BICMOS process.

10. The method of claim 1, wherein forming a MEMS device further comprises filling a portion of the cavity via at least one release aperture.

11. The method of claim 1, further comprising forming an isolation trench.

* * * * *